(12) United States Patent
Rathmann

(10) Patent No.: US 7,375,287 B2
(45) Date of Patent: May 20, 2008

(54) ASSEMBLY FOR ACCOMMODATING THE POWER ELECTRONICS AND CONTROL ELECTRONICS OF AN ELECTRIC MOTOR

(75) Inventor: Robert Rathmann, Aichach (DE)

(73) Assignee: Minebea Co., Ltd., Kitasuku-gun, Nagano-ken (JP)

( * ) Notice: Subject to any disclaimer, the term of this patent is extended or adjusted under 35 U.S.C. 154(b) by 92 days.

(21) Appl. No.: 10/523,591

(22) PCT Filed: Aug. 11, 2003

(86) PCT No.: PCT/EP03/08896

§ 371 (c)(1),
(2), (4) Date: Feb. 1, 2006

(87) PCT Pub. No.: WO2004/025812

PCT Pub. Date: Mar. 25, 2004

(65) Prior Publication Data

US 2006/0152907 A1      Jul. 13, 2006

(30) Foreign Application Priority Data

Aug. 28, 2002   (DE) ............................... 102 39 512

(51) Int. Cl.
  *H05K 1/16*       (2006.01)
(52) U.S. Cl. ..................... 174/260; 174/257; 361/720; 361/721; 361/777
(58) Field of Classification Search ................. 174/257, 174/260, 262, 261, 255; 361/777, 778
See application file for complete search history.

(56) References Cited

U.S. PATENT DOCUMENTS 5,339,217 A      8/1994   Cohen et al.

(Continued)

FOREIGN PATENT DOCUMENTS

DE       19636723       *   3/1997

(Continued)

OTHER PUBLICATIONS

Furnival, Courtney R., "Part 1: Design Guidelines for Performance & Reliability with Thermagon IMpcb and 1KA Dielectric," The T-Lam System T-Guide for Performance, Sep. 17, 2002, p. 1-29, A13866-00 Rev. B, Laird Technologies, Cleveland, OH.
"Aluminiumnitrid," Wikipedia, Last updated Jul. 1, 2007, Retrieved Oct. 1, 2007, <http://de.wikipedia.org/wiki/Aluminiumnitrid>.

*Primary Examiner*—Ishwar Patel
*Assistant Examiner*—Yuriy Semenenko
(74) *Attorney, Agent, or Firm*—Duane Morris LLP

(57) ABSTRACT

An arrangement to receive and accommodate the power and control electronics of an electric motor comprises a first circuit board mounted with control electronic components, a second circuit board mounted with power electronic components which has a substrate that not only has electrically insulating properties but also good thermal conductivity, a cooling element in thermally conductive contact with the substrate of the second circuit board and a motor housing connected to the cooling element.

Since the first circuit board can be constructed in a conventional manner and satisfactory cooling of the power electronic components arranged on the second circuit board has been provided for by the provision of the second circuit board that conducts heat to the cooling element, a compact, cost-saving overall design and construction has been achieved which is reliable when the electric motor is in operation.

11 Claims, 4 Drawing Sheets

U.S. PATENT DOCUMENTS

| | | |
|---|---|---|
| 5,532,533 A | 7/1996 | Mizutani |
| 5,825,107 A | 10/1998 | Johnson et al. |
| 6,198,183 B1 | 3/2001 | Baeumel et al. |
| 6,201,701 B1 * | 3/2001 | Linden et al. .............. 361/720 |
| 6,400,109 B1 | 6/2002 | Helmut |
| 6,472,785 B2 | 10/2002 | Petit et al. |
| 6,501,662 B2 * | 12/2002 | Ikeda ........................ 361/760 |

FOREIGN PATENT DOCUMENTS

| | | |
|---|---|---|
| DE | 19735074 | 9/1998 |
| DE | 19730865 * | 2/1999 |
| DE | 19939933 A1 | 4/2000 |
| DE | 19900603 A1 | 7/2000 |
| DE | 19949914 | 10/2000 |
| DE | 69508183 T2 | 10/2000 |
| DE | 19924994 | 12/2000 |
| DE | 10033561 | 6/2001 |
| DE | 10121554 A1 | 3/2002 |
| WO | WO9858825 | 12/1998 |

* cited by examiner

ASSEMBLY FOR ACCOMMODATING THE POWER ELECTRONICS AND CONTROL ELECTRONICS OF AN ELECTRIC MOTOR

FIELD OF INVENTION

The application claims priority to the filing date of German Patent Application No. 102 39 512.8 filed Aug. 28, 2002 and PCT Application No. PCT/EP03/08896 filed Aug. 11, 2003, the specification of each application is incorporated herein in its entirety.

The invention relates to a housing arrangement to accommodate the power and control electronics of an electric motor, where this housing arrangement can also include the electric motor itself.

BACKGROUND

The invention relates in general to the field of electronically commutated, brushless DC motors. These kinds of motors may find application in a variety of different areas such as in automobile technology for blowers, coolant pumps or to support the steering system. Other areas include, for example, fan blowers in power supplies or spindle motors in hard disk drives for data processing systems, to name but a few possible applications.

An electronically commutated, brushless DC motor basically consists of a shaft, a rotor assembly having one or more permanent magnets arranged on the shaft and a stator assembly comprising a stator core and phase windings. Two bearings spaced apart axially are arranged on the shaft for the purpose of journaling the rotor assembly and the stator assembly with respect to each other.

FIG. 1 shows a schematic diagram of a circuit to drive a three-phase DC motor. In the illustrated embodiment, the control circuit comprises six power transistors as well as other control electronics, not illustrated in the drawing, which control the operation of the DC motor. In the prior art it is standard practice to set up the control electronics for the DC motor on a printed circuit board as a closed unit which is plugged into the motor or connected to the motor in some other way. The electronic circuit board is connected to the motor via connecting wires and leads which are connected to the circuit board through soldering, using connectors or any similar means. Plug-in and soldered connections, as well as the length of the leads, increase the electrical resistance of the DC motor and consequently reduce the electric voltage available at the motor windings.

The power components of an electric motor, particularly a heavy-duty electric motor in a harsh environment, such as in a motor vehicle, are often heated to temperatures of over 100° C. To avoid overheating, it is therefore necessary to cool such power components in order to prevent their premature breakdown.

On the other hand, it is necessary to accommodate the power components as well as the control components of the electric motor on electrically insulating circuit boards and to connect them to each other. It is thus common practice to make the substrate of conventional circuit boards from a plastic having good electrically insulating properties. A plastic of this kind, however, has poor thermal conductivity.

A circuit board material which is not only electrically insulating but also conducts heat well is known (company publication "The T-Lam System—T-Guide for performance", THERMAGON Inc., Ohio/USA, 16, Nov. 1999).

The object of the invention is to provide an arrangement to accommodate the power and control electronics of an electric motor which meets the requirements, on the one hand, for good thermal conductivity of the heat generated in the power components and, on the other hand, for good electrical insulation of both the power components and the control components, combined with a simple, space-saving, low-cost design and construction.

SUMMARY

To achieve this object, a housing arrangement according to claim 1 is provided.

The invention provides an arrangement to accommodate the power and control electronics of an electric motor, comprising a first circuit board mounted with control electronic components a second circuit board mounted with power electronic components which has a substrate that not only has electrically insulating properties but also good thermal conductivity; a cooling element in thermally conductive contact with the substrate of the second circuit board.

By separating the power components from the control components according to the invention and by arranging these two groups of components spaced apart from each other on two separate circuit boards of differing consistency, and also by associating a cooling element only with the circuit board carrying the power components, the object is achieved through a surprisingly simple and low-cost design and construction, and in an effort to save costs, using only expensive circuit board material for the second circuit board and not for the first circuit board which can be made of conventional circuit board plastic which, although having good insulating properties, has poor thermal conductivity.

On the one hand, the invention ensures good thermal connection of the power semiconductors to the heat sink and, on the other hand, enjoys the advantage of far-reaching thermal decoupling of the power electronics from the control electronics. As a result, the power electronics which heat up to a greater extent cannot influence the operation of the control electronics. In addition, a very compact design for the entire electronic assembly is produced which takes up only a limited space in the electric motor. The arrangement according to the invention is moreover vibration-proof, particularly since there is no need for extra connections via the phase windings and the control lines.

The two circuit boards are preferably not connected to each other using cable connector technology as is known in the prior art, but rather by using special power semiconductor housings in which the connecting pins of the power semiconductors can be bent as required.

In a further development of the invention, the first circuit board is arranged above the copper layer of the second circuit board, being spaced apart from it and essentially parallel to it. It particularly advantageous if the plastic layer of the first circuit board is covered with a copper coating on both sides so that tracks can be formed on the underside of this circuit board as well, which goes to save space and, despite the power and control components being arranged on different circuit boards, allows the components of the opposing tracks of the two circuit boards, and thus the electrical components, to be connected to each other easily.

The cooling element, that preferably has a thick-walled aluminum plate, is only connected directly to the second circuit board in a thermally conductive way since the power components arranged on the first circuit board do not heat up significantly during operation and thus do not require any special cooling.

The second circuit board is preferably constructed in three layers consisting of a copper layer, a ceramic layer with good thermal conductivity and electrically insulating properties and a metal layer, a metal having good thermal conductivity, such as aluminum or an aluminum alloy, being used as the metal layer.

A preferred circuit board material of this type is described in the abovementioned company publication and is available on the market under the name "Thermagon IMpcb".

Further beneficial embodiments of the invention are cited in the other subordinate claims.

BRIEF DESCRIPTION OF THE DRAWINGS

The invention is described in more detail below on the basis of an embodiment with reference to a schematic drawing.

The figures show.

DETAILED DESCRIPTION

Figure 1:
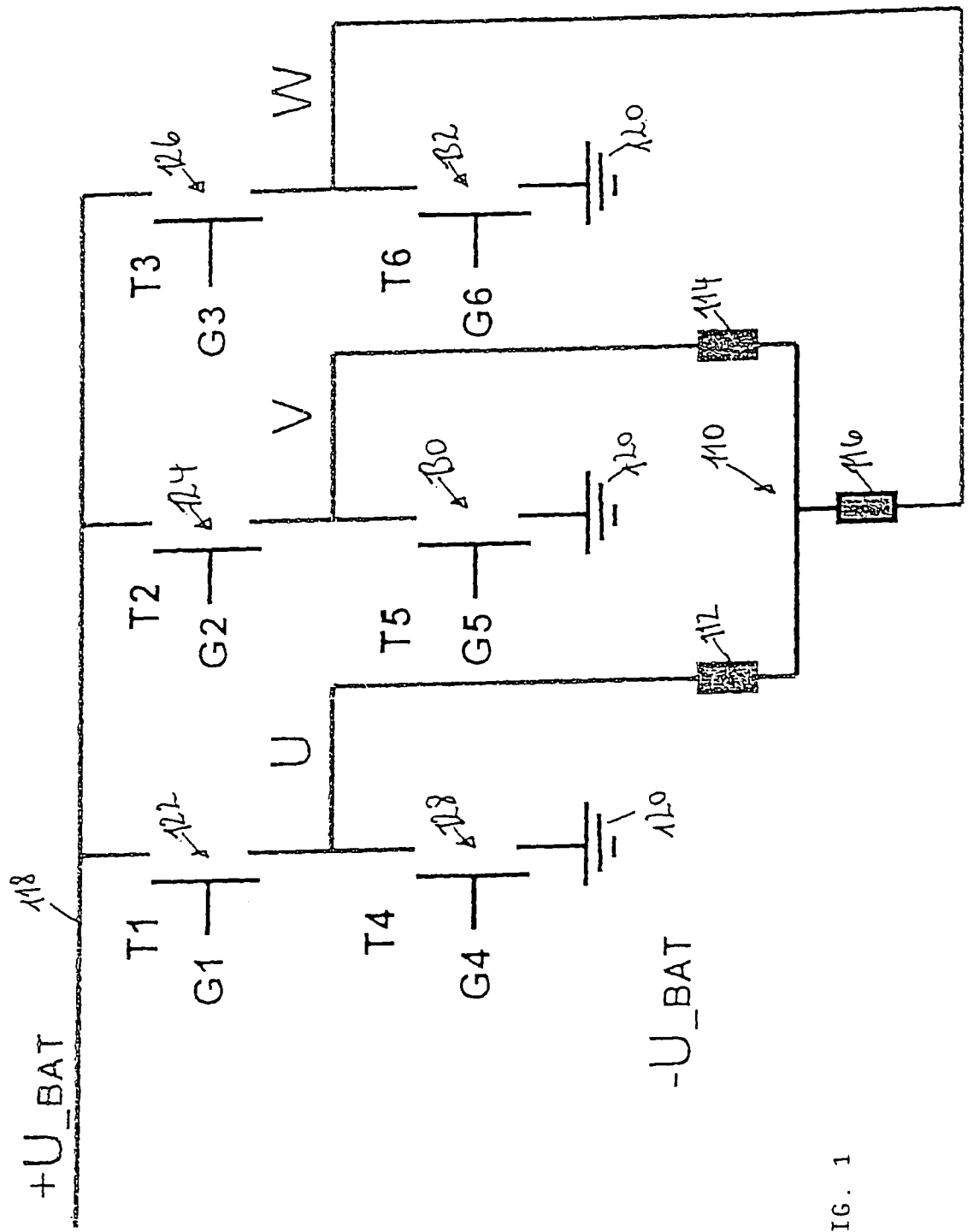
FIG. 1 a schematic circuit diagram of the control electronics for a three-phase DC motor.

FIG. 1 shows a schematic circuit diagram of the control electronics for a three-phase DC motor. The DC motor comprises three phase windings U, 112; V, 114; W, 116, which are schematically shown in FIG. 1 in a star connection 110. The three windings 112, 114, 116 are connected between a positive supply rail 118 and a negative supply rail 120. The positive supply rail 118 carries the potential $+U_{BAT}$, and the negative supply rail 120 carries the potential $-U_{BAT}$. The phase windings 112, 114, 116 are connected via six power switching components T1, 122; T2, 124; T3, 126; T4, 128; T5, 130; T6, 132 to the supply rails 118, 120 according to control signals. The power switching components 122 to 132 are preferably power transistors. They have control leads which are indicated in FIG. 1 by G1 to G6. The control leads correspond in particular to the gates of the power transistors. By applying appropriate control signals to the gates of the power transistors, the phase windings 112 to 116 of the DC motor are energized for the purpose of controlling its operation. Methods of controlling a brushless electronically commutated DC motor are described, for example, in DE 100 33 561 A1 and U.S. Pat. No. 6,400,109 B1, to which reference is made.

Figure 2:
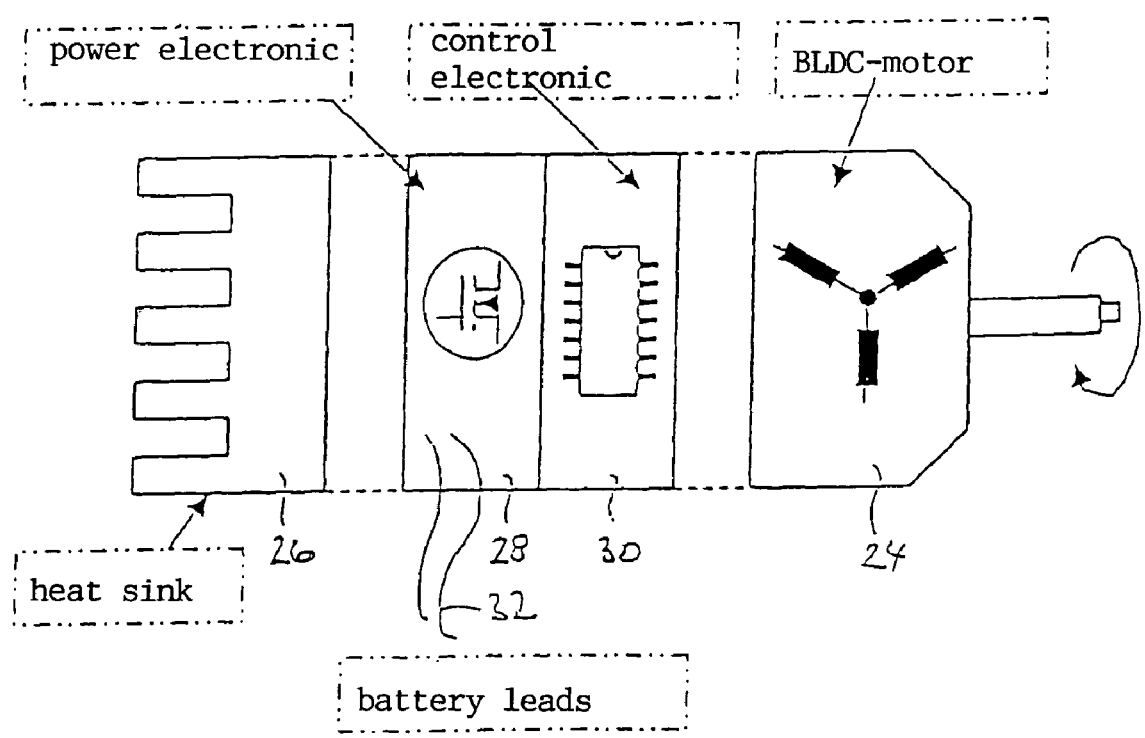
FIG. 2 a schematic block diagram of the basic structure of the arrangement according to the invention.

Using the form of a block diagram, FIG. 2 schematically shows the basic structure of the arrangement according to the invention. In FIG. 2, the reference number 24 indicates a brushless electronic DC motor, 26 a heat sink, 28 the power electronics and 30 the control electronics. The battery supply lines are indicated by 32. The construction according to the invention illustrated schematically in FIG. 2, is shown in more detail in FIG. 3.

Figure 3:
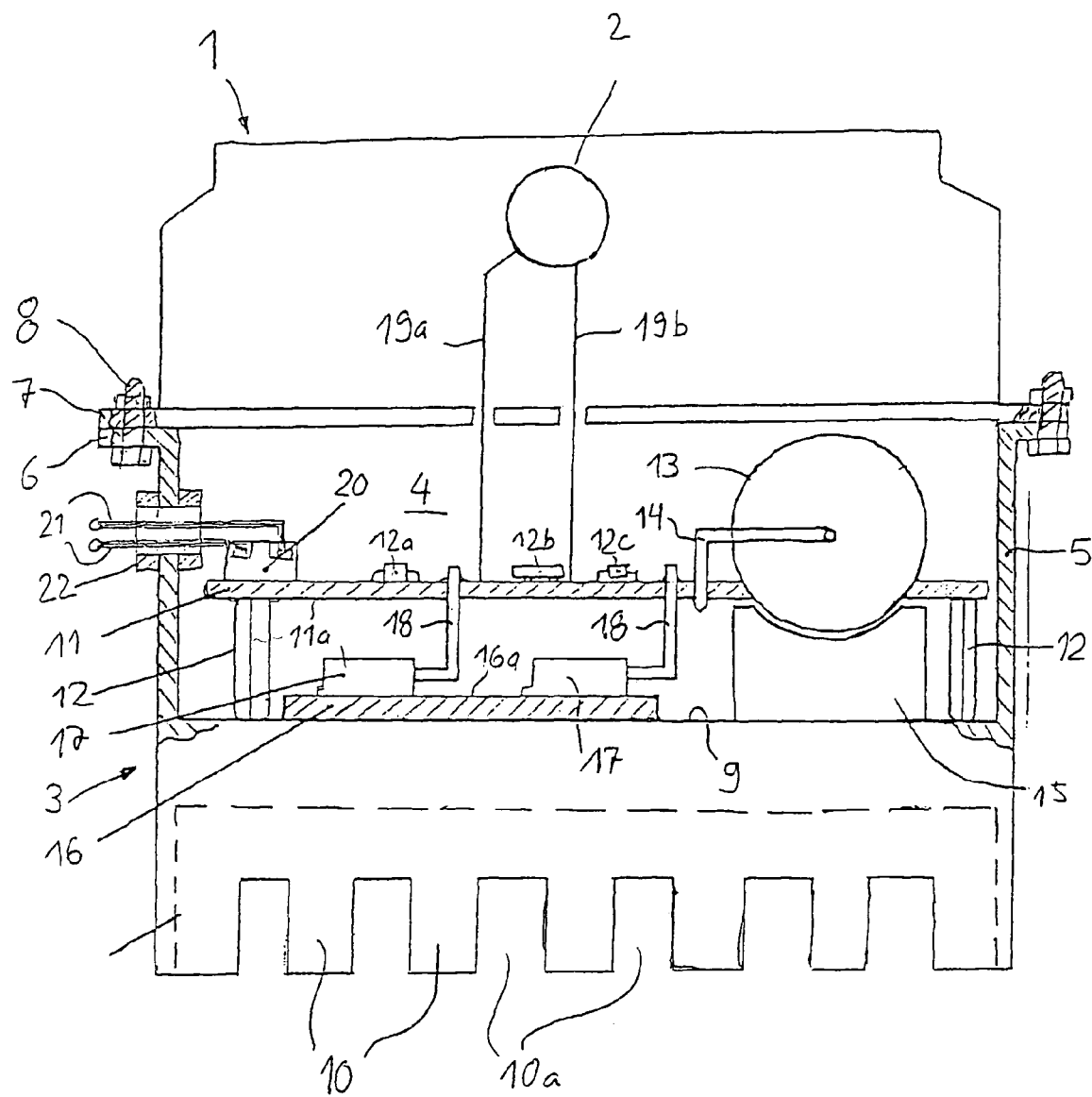
FIG. 3 a preferred embodiment of a housing arrangement according to the invention in a partially sectioned view.

In FIG. 3 the reference numbers 1 indicate a motor housing, 2 an electric motor, 3 a heat sink made of aluminum and 4 a space to accommodate the power and control electronics of the motor 2.

The accommodating space 4 is enclosed by a cylindrical wall 5 which juts up from the heat sink 3 as an integral piece and ends in an upper annular flange 6 which is tightly screwed to a lower annular flange 7 of the motor housing 1 by means of screws 8.

The accommodating space 4 has a base 9 formed by the heat sink within the cylindrical wall 5 and on its underside, cooling fins 10 distributed evenly around the circumference, the surrounding air flowing through the spaces 10a between the cooling fins 10.

Within the accommodating space, a first circuit board 11 is supported on the base 9 by means of spacers 12. This first circuit board 11 is of a conventional construction having a substrate layer made of a hard, electrically insulating plastic with poor thermal conductivity such as PTFE, and a single or double-sided copper coating for the purpose of creating tracks in the usual way on both the topside as well as on the underside of the substrate layer where applicable.

In an alternative embodiment of the invention, instead of using spacers 12, the circuit board 11 can also be supported using a plinth or some other holding device which is firmly fixed to the cylindrical wall 5 of the heat sink 3. For example, the circuit board 11 can be fixed to a plinth of this kind by means of a screw. Alternatively, the circuit board 11 can also be accommodated in an appropriate recess in the wall 5. This embodiment has the advantage of providing a particularly vibration-proof support for the circuit board 11.

The circuit board 11 carries control electronic components 12a, 12b, 12c on its topside. Moreover, a capacitor is accommodated in an opening in the circuit board and electrically connected to it via connecting pins 14 which are soldered to the underside of the circuit board 11. The capacitor 13 is supported directly on the metallic base 9 of the heat sink 3 via a metallic support 15, allowing any heat generated in the capacitor to be led off directly via the support 15 to the heat sink 3.

Furthermore, a circuit board 16 is fixed to the base 9, the circuit board 16 having a three-layered structure with an upper copper layer, an insulating layer made of a ceramic material with good electrically insulating and thermally conductive properties and a base layer made of a metal that conducts heat well such as aluminum or an aluminum alloy. Several power electronic housings 17 are soldered to the topside of this circuit board and are soldered to the first circuit board 11 via bent connecting pins 18. The standard power electronic components are encapsulated in the power electronic housings 17.

Connecting leads 19a, 19b are led from the topside of the circuit board 11 to the motor 2. In practice, these include signal lines and power lines. Further, a plug 20 for battery supply lines 21 is provided on the circuit board 11, the supply lines being led from the inner space 4 to the outside via a duct 22 in the wall 5.

With the described arrangement, the components that heat up during operation, mainly the power electronic housings 17 including the power electronic components within and also the capacitor 13 are cooled down through their direct connection to the heat sink 3 in such a way that undue overheating of these components is prevented.

y arranging the control electronic components 12a-12c on a conventional, low-cost circuit board, expensive circuit board material, such as the material used in circuit board 16, can be saved. Arranging the circuit boards 11, 16 one on top of the other in the inner space 4, as illustrated and described, saves space.

Figure 4:
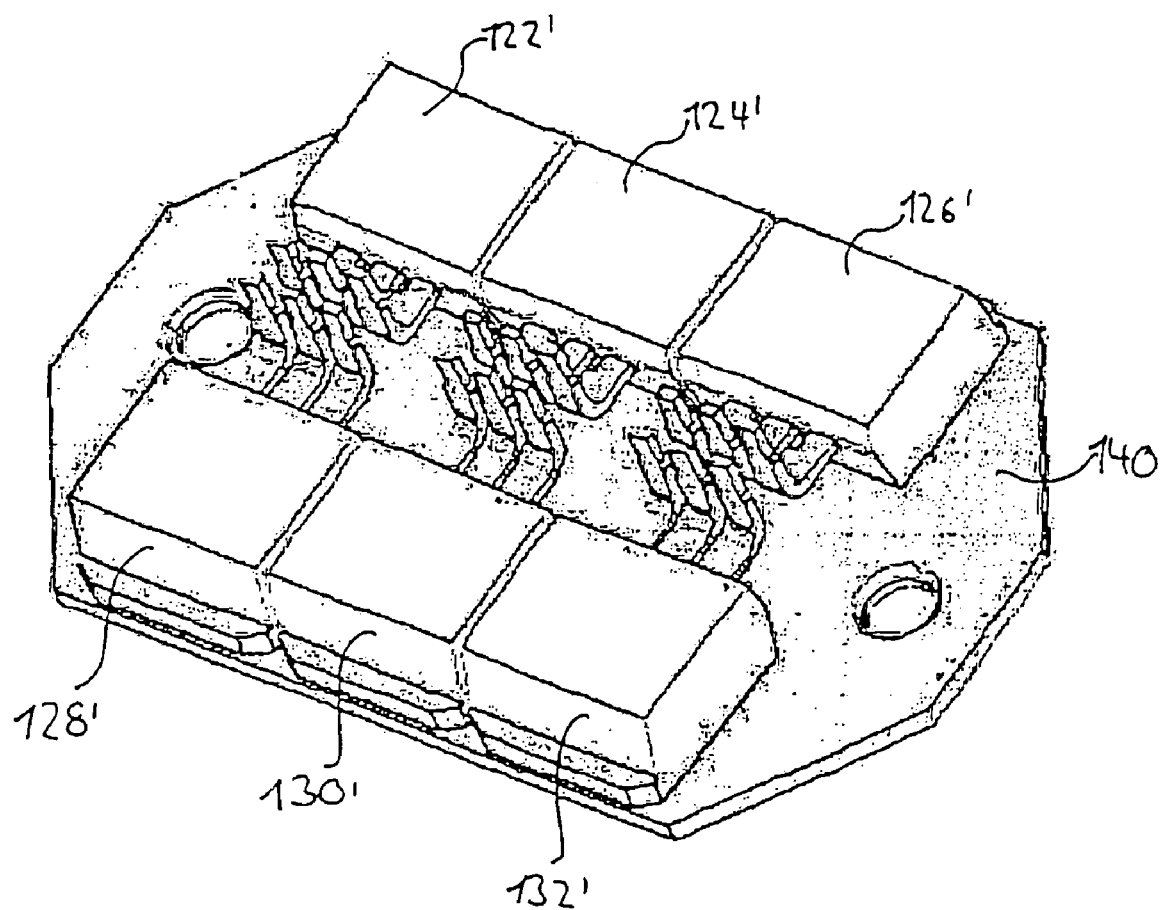
FIG. 4 an arrangement of several power transistors showing how they could be applied in the invention.

FIG. 4 schematically shows the arrangement of the power transistors, such as the transistors 122'-132' from FIG. 1, on a supporting plate, for example the second circuit board 16.

Each power transistor has a power electronic housing and connecting pins which can be directly connected to the first circuit board 11.

Even should the electric motor 2 be used in harsh conditions, such as in a motor vehicle, the arrangement according to the invention will produce reliable continuous operation in a compact, hard-wearing overall design and construction.

The characteristics revealed in the above description, the claims and the figures can be important for the realization of the invention in its various embodiments both individually and in any combination whatsoever.

The invention claimed is:

1. An arrangement to accommodate the power and control electronics of an electric motor, comprising:
    a first circuit board mounted with control electronic components;
    a second circuit board mounted with power electronic components which has a substrate that not only has electrically insulating properties but also good thermal conductivity; and
    a cooling element in thermally conductive contact with the substrate of the second circuit board,
    wherein the first circuit board has a copper layer on a substrate layer made of electrically insulating plastic and is arranged spaced apart from the second circuit board, and
    wherein at least one power electronic housing of the power electronic component is soldered onto the second circuit board and comprises connecting pins which are soldered to the first circuit board mounted with the control components.

2. The arrangement according to claim 1, wherein the substrate of the second circuit board has a three-layer construction with a copper layer, a base layer in contact with the copper layer made of a material that has good electrically insulating properties and good thermal conductivity and a metal layer made of a metal which conducts heat well and is connected to the base layer in a thermally conductive way, and that the metal layer is in thermal conductive contact with the cooling element.

3. The arrangement according to claim 2, wherein the base layer is made of a ceramic material having high thermal conductivity and good dielectric insulating properties and that the metal layer is made of aluminum or an aluminum alloy.

4. The arrangement according to claim 2, wherein the cooling element has a heat sink which is in extensive surface contact with the metal layer in a thermally conductive way and is made of metal, preferably of aluminum.

5. The arrangement according to claim 4, wherein the first circuit board is supported directly on the heat sink by means of spacers.

6. The arrangement according to claim 4, wherein the first circuit board is directly supported on a wall of the heat sink, wherein a bracing means for the circuit board is provided on the wall of the heat sink.

7. The arrangement according to claim 4, wherein the heat sink has an accommodating space for the first and the second circuit board including the components located on them and is connected via a surrounding flange to a counter flange of a motor housing.

8. The arrangement according to claim 4, wherein the heat sink has cooling fins and wherein air can flow through spaces between the cooling fins.

9. The arrangement according to claim 4, wherein the heat sink is made of aluminum or an aluminum alloy.

10. The arrangement according to claim 1, wherein the first circuit board is arranged above and essentially parallel to the second circuit board.

11. The arrangement according claim 1 wherein a motor housing is connected to the cooling element.

* * * * *